United States Patent
Toyoda

(10) Patent No.: US 7,094,641 B2
(45) Date of Patent: Aug. 22, 2006

(54) METHOD FOR FORMING WIRING PATTERN, METHOD FOR MANUFACTURING SEMICONDUCTOR DEVICE, ELECTRO-OPTIC DEVICE AND ELECTRONIC EQUIPMENT

(75) Inventor: Naoyuki Toyoda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 189 days.

(21) Appl. No.: 10/902,109

(22) Filed: Jul. 30, 2004

(65) Prior Publication Data

US 2005/0064648 A1    Mar. 24, 2005

(30) Foreign Application Priority Data

Aug. 12, 2003    (JP) ............................ 2003-292465

(51) Int. Cl.
*H01L 21/8238* (2006.01)
*H01L 21/00* (2006.01)
*H01L 21/302* (2006.01)
*H01L 21/461* (2006.01)
*H01L 21/31* (2006.01)

(52) U.S. Cl. ................... 438/222; 438/707; 438/57; 438/776

(58) Field of Classification Search ............... 438/222, 438/707, 160, 473, 746, 771, 57
See application file for complete search history.

(56) References Cited

U.S. PATENT DOCUMENTS 6,121,130 A * 9/2000 Chua et al. ............... 438/623

2005/0042430 A1 * 2/2005 Toyoda ..................... 428/209
2005/0095866 A1 * 5/2005 Toyoda ..................... 438/707

FOREIGN PATENT DOCUMENTS

| JP | 06-099667 | 4/1994 |
| JP | 09-127644 | 5/1997 |
| JP | 2001-514106 | 9/2001 |
| JP | 2002-164635 | 6/2002 |

* cited by examiner

*Primary Examiner*—Chuong Anh Luu
(74) *Attorney, Agent, or Firm*—Oliff & Berridge, PLC

(57) ABSTRACT

A method is provided that is capable of forming a wiring pattern having an extremely flat surface and few convexo-concave shapes on a substrate on which the wiring pattern is formed. The method to form a wiring pattern includes a bank forming process, a conductive layer forming process and a transferring process. Here, a photothermal converting layer including a photothermal converting material that converts light energy to thermal energy and a sublimation layer including a sublimable material are stacked on a first substrate in this order. In the bank forming process, a first light irradiation is performed to a fixed region on a surface of the first substrate from the sublimation layer side so as to sublimate a part of the sublimation layer, thereby forming banks made of the sublimation layer to a region excluding the region for light irradiation. In the conductive layer forming process, a conductive layer is provided between the banks. In the transferring process, a conductive pattern layer including the conductive layer and the banks, and a substrate to be treated are faced. Then, a second light irradiation is performed to the faced substrates so as to transfer the conductive pattern layer to the substrate to be treated.

23 Claims, 7 Drawing Sheets

METHOD FOR FORMING WIRING PATTERN, METHOD FOR MANUFACTURING SEMICONDUCTOR DEVICE, ELECTRO-OPTIC DEVICE AND ELECTRONIC EQUIPMENT

BACKGROUND OF THE INVENTION

1. Field of Invention

Exemplary aspects of the present invention relate to a method for forming a wiring pattern, a method for manufacturing a semiconductor device, an electro-optic device and electronic equipment.

2. Description of Related Art

Along with the popularization of notebook personal computer and cellular phones or the like, thin-and-light liquid crystal display devices are widely used. This type of related art liquid crystal display device has a construction in which a liquid crystal layer is sandwiched between an upper substrate and a lower substrate. Specifically, the liquid crystal display is constructed by a glass substrate, a gate scanning electrode and a source electrode both of which are wired on the glass substrate so as to intersect each other, a drain electrode wired on the glass substrate, a pixel electrode (ITO) connected to the drain electrode, an insulator provided between the gate scanning electrode and the source electrode, and a TFT (Thin Film Transistor) formed by a thin film semiconductor.

To form a wiring pattern in an electro-optic device typified by such a related art liquid crystal display device, for example, a method in which a dry process and a photolithographic etching are combined is used. However, such a dry process has disadvantages as follows. The manufacturing cost is relatively high. Also, it is difficult to cope with a large size substrate in production. Consequently, a related art method such that a wiring pattern is formed on a substrate using an inkjet is employed. See Japanese Unexamined Patent Publication No. 2002-164635.

SUMMARY OF THE INVENTION

Even though in many related art methods, a lot of convexo-concave shapes remain on a substrate on which a wiring pattern has been formed, if such convexo-concave shapes become relatively large, for example, there is a possibility that an incomplete application occurs in an assembled liquid crystal display. Specifically, if the substrate including such a wiring pattern is applied to a liquid crystal display device, a rubbing treatment is performed on the surface of the substrate on which an orientation layer has been formed. However, the rubbing treatment may result in differences between rubbing at the convexo and concave parts. This uneven rubbing treatment causes differences in an orientation restriction force of liquid crystal in each region, thereby resulting in an incomplete application.

Taking the aforesaid and/or other situations into account, exemplary aspects of the present invention relate to a method to form a wiring pattern that is applicable for not only a liquid crystal display device but also an electro-optic device or the like that need wiring patterns. Exemplary aspects of the present invention also provide with methods to form a wiring pattern that form an extremely flat surface with few convexo-concave shapes on a substrate on which the wiring pattern is formed.

In order to address and/or solve the above-mentioned and/or other problems, a method to form a wiring pattern of a first exemplary aspect of the invention includes a layer stacking process, a bank forming process, a conductive layer forming process, and a transferring process. In the layer stacking process, a sublimation layer, including a sublimable material, is stacked on a photothermal converting layer including a photothermal converting material that converts light energy to thermal energy. In the bank forming process, a first light irradiation is performed to a fixed region of the sublimation layer so as to sublimate a part of the sublimation layer, thereby forming banks made of the sublimation layer to a region excluding the fixed region, specifically the region for light irradiation. In the conductive layer forming process, a conductive layer is provided between the banks so as to form a conductive pattern layer formed by the conductive layer and the banks. In the transferring process, a second light irradiation is performed to a fixed region of the photothermal converting layer so as to transfer the conductive pattern layer to a substrate to be treated while keeping the substrate to be treated and the conductive pattern layer to be faced.

In order to address and/or solve the above-mentioned and/or other problems, a method to form a wiring pattern of a second exemplary aspect of the invention includes a photothermal converting layer forming process, a sublimation layer forming process, a bank forming process, a conductive layer forming process, and a transferring process. In the photothermal converting layer forming process, a photothermal converting layer including a photothermal converting material that converts light energy to thermal energy is formed on a substrate. In a sublimation layer forming process, a sublimation layer including a sublimable material is stacked on the photothermal converting layer. In the bank forming process, a first light irradiation is performed to a fixed region of the sublimation layer so as to sublimate a part of the sublimation layer, thereby forming banks made of the sublimation layer to a region excluding the fixed region, specifically the region for light irradiation. In the conductive layer forming process, a conductive layer is provided between the banks so as to form a conductive pattern layer formed by the conductive layer and the banks. In the transferring process, a second light irradiation is performed to a fixed region of the photothermal converting layer so as to transfer the conductive pattern layer to a substrate to be treated while keeping the substrate to be treated and the conductive pattern layer to be faced.

As mentioned above, the method to form a wiring pattern of the first and second exemplary aspect of the invention is the following. Light is selectively irradiated (the first light irradiation) to a fixed region of the first substrate that includes the photothermal converting layer and the sublimation layer. Heat is generated from the photo-thermal converting layer due to the irradiated light. The heat sublimates the sublimable material from the region for light irradiation of the sublimation layer so as to be removed from the substrate (or the photothermal converting layer). Accordingly, this makes it possible to form a bank pattern made of the sublimation layer on the substrate (or the photothermal converting layer) corresponding to the region for light irradiation. Then, the conductive layer is provided in the banks. Subsequently, the banks and the conductive pattern layer, which includes the conductive layer, are faced such that the light irradiation (the second light irradiation) is performed to the substrates that are faced. Heat is applied to the sublimation layer in the conductive pattern layer from the photothermal converting layer so as to transfer the conductive pattern layer to the substrate to be treated. As a result, a fixed conductive pattern layer is formed on the substrate to be treated. In this case, since a surface layer of the conductive layer (wiring pattern) in the conductive pattern layer is originally an interface to the photothermal converting layer, the surface layer of the conductive layer has a surface shape have extreme flatness with few convexo-concave. Thus, a wiring pattern formed by the above-mentioned methods can contribute to enhance display characteristics if the wiring pattern is used in an electro-optic device, such as a liquid crystal display device or the like. In the first and the second exemplary aspect of the invention, since the banks are formed by removing the sublimable material corresponding to the region for light irradiation, it is possible to reduce the likelihood or prevent a shape of the banks to become deteriorated by an incomplete transferring or the like as compared with, for example, the case in which the banks are formed by a transferring process.

In the method for forming a wiring pattern, the photothermal converting material may be mixed into the substrate and also into the sublimation layer. This can simplify processes.

In the method to form a wiring pattern, the sublimation layer forming process can include a process in which an insulator is formed on the photothermal converting layer, and then the sublimation layer is formed on the insulator. In this case, an interface between the insulator and the sublimation layer becomes the surface on which the wiring pattern is formed. As mentioned above, the surface is extremely flat so that the method to form a wiring pattern serves to achieve high reliability in application for electro-optic devices or the like.

Also, in the method to form a wiring pattern, a gas producing layer, including a gas producing material that produces gas by light or heat, can be provided between the substrate and the sublimation layer, and also between the substrate and the insulator. The transfer of the conductive pattern layer to the substrate to be treated can be performed more reliably by providing such a gas layer.

The light irradiation condition can differ between the first light irradiation and the second light irradiation. Thus, the optimum light irradiation condition may be employed for each of the following cases. The first case is the case in which a part of the sublimation layer is removed by ablation with the first light irradiation. The second case is the case in which the conductive pattern layer, including the sublimation layer (banks), is transferred by the second light irradiation. Specifically, if the insulator is formed between the photothermal converting layer and the sublimation layer, the conditions can be set as the following. In the first case, the light is irradiated under conditions such that the insulator is not removed. In the second case, the light is irradiated under conditions such that the insulator is transferred to the substrate to be treated.

The first light irradiation and/or the second light irradiation can be performed with laser light. Specifically, a light having the wavelength by which the photothermal converting material can produce heat is used. In the first light irradiation, the light can be irradiated to a fixed region using a mask having the fixed pattern, or relatively transferring the first substrate on which the sublimation layer is stacked to the light irradiated.

The second light irradiation can be performed by the conditions such that the conductive pattern layer is transferred to the substrate to be treated, and the conductive layer provided between the banks can be fired. In order to provide the conductive layer between the banks, the method can be employed by which liquid, including the conductive material, is dropped between the banks using a liquid drop ejecting device, for example, an inkjet device or the like. The conductive material provided between the banks is required to be fired. If this process is performed using the heat produced in the photothermal converting layer by the second light irradiation, the firing process can be omitted. As a result, this makes it possible to cut down manufacturing costs.

In addition, the transferring process can be performed under reduced pressure. In this case, the conductive pattern layer and the substrate to be treated are more firmly stuck together. If the photothermal converting layer and the conductive pattern layer are required to be separated, the reduced pressure is released.

In the sublimation layer forming process, an adjustment material that adjusts lyophilicity can be included in the sublimation layer. This has the following advantages. In the case in which liquid, including conductive material, is provided to the banks after the bank forming process, positions and wetting and spreading conditions of the liquid to be provided can be controlled. Especially, in the sublimation layer forming process, a plurality of sublimation layers, each of which has different lyophilicity can be formed. The construction has the following and/or other advantages in which a first sublimation layer and a second sublimation layer having higher lyophobicity than that of the first sublimation layer are formed in this order. This makes it possible to control positions and, wetting and spreading conditions of the liquid to be provided in a desired condition. For example, in the case in which liquid is provided between the banks, the liquid can wet and spread over the vicinity of the bottom between the banks. Also, even though the liquid is provided in the vicinity of the upper part including the upper surface of the banks, the region having lyophobicity formed at the upper part of the bank can flow the liquid provided in the vicinity of the upper part to the bottom between the banks.

Other than the construction where the adjustment material is preliminarily mixed into the sublimation layer that forms the banks, a surface treatment that adjusts the lyophilicity may be performed after forming the bank pattern by the light irradiation. In this way, the liquid can be provided between the banks. In the bank forming process, there is a problem in that residues of the sublimation material remain at the position for conductive layer forming or the like, can be reduce or prevented from occurring by including the process in which the material sublimated from the sublimation layer is sucked and removed.

A method for manufacturing a semiconductor device of a third and a fourth exemplary aspect of the invention is characterized in that the above-mentioned methods to form a wiring pattern are employed in forming its wiring patterns. In this case, the semiconductor device including wirings having few convexo-concave shapes on its surface can be achieved. This makes it possible, for example, to reduce the likelihood or prevent the problem of breaks in wiring from occurring. In manufacturing a semiconductor device, a three-dimensional wiring, in which wiring is stacked in multiple numbers, can be achieved using the above-mentioned methods to form a wiring pattern.

An electro-optic device of a fifth and a sixth exemplary aspect of the invention includes the wiring pattern formed by the above-mentioned methods, or the semiconductor device manufactured by the above-mentioned methods. For the electro-optic device, a liquid crystal display device, an organic electro luminescence display device, and a plasma display device or the like are exemplified. In addition, electronic equipment of a seventh exemplary aspect of the invention includes the above-mentioned the electro-optic device.

The liquid drop ejection method with the above-mentioned liquid drop ejecting device is realized by the liquid drop ejecting device equipped with an ejection head. The liquid drop ejecting device includes the inkjet device equipped with an inkjet head. The inkjet head of the inkjet device can eject the liquid drop quantitatively by an inkjet method. For example, the device can quantitatively and intermittently eject from 1 to 300 nanograms of the liquid drop per one dot. A dispensing device may be applicable as the liquid drop ejecting device. For the liquid, the liquid may have a viscosity capable of ejecting (dropping) from an ejection nozzle of the ejection head of the liquid drop ejecting device. The liquid is adjusted by solving or dispersing a conductive material to a fixed solvent (both aqueous and oil-based are applicable).

DETAILED DESCRIPTION OF EXEMPLARY EMBODIMENTS

Method for Forming a Wiring Pattern

A method to form a wiring pattern of a first exemplary embodiment of the invention will be described below with reference to the drawings.

Figure 1:
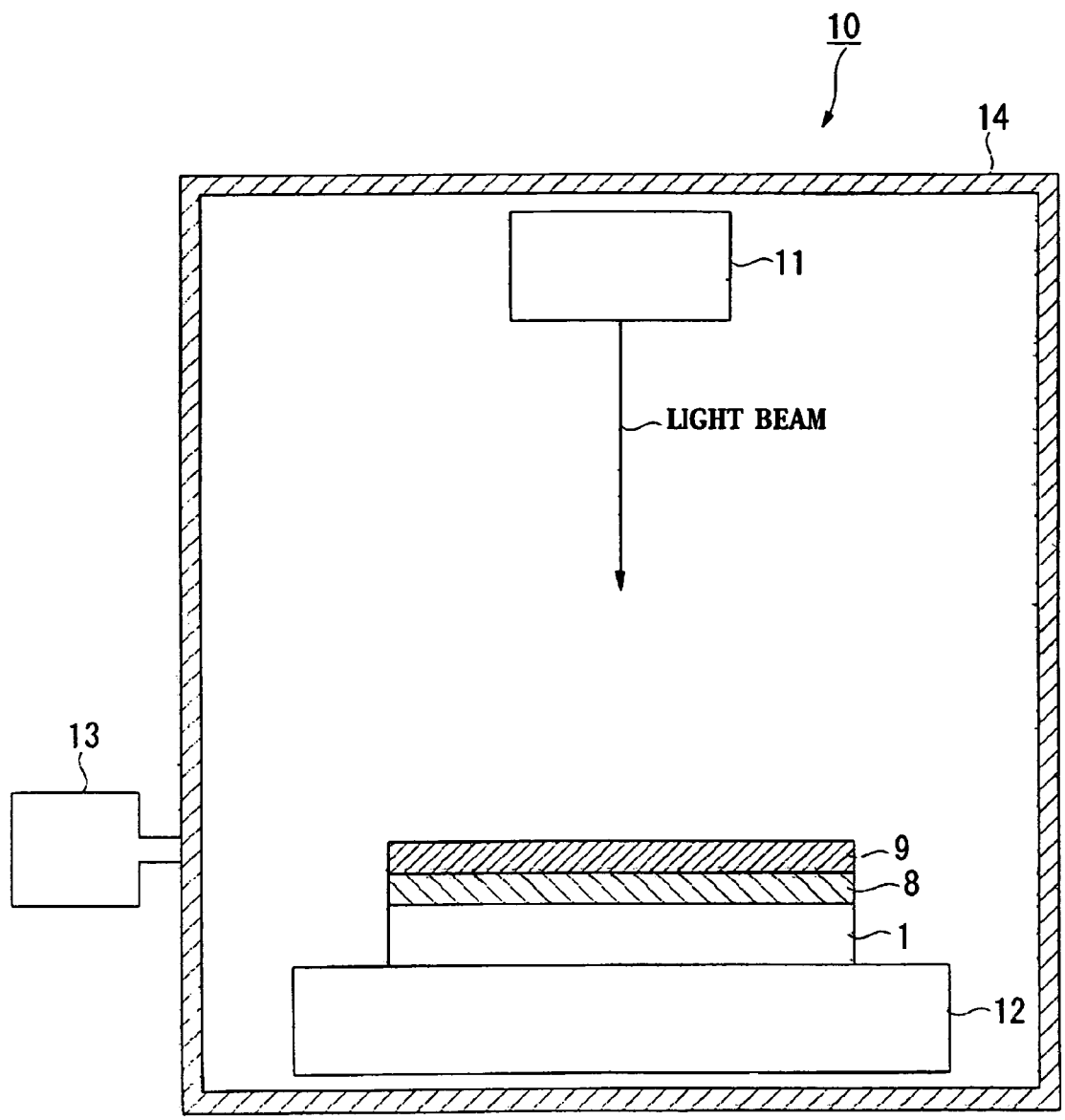
FIG. 1 is a schematic illustrating a photo irradiation device of a first exemplary embodiment of the invention that is used for the method to form a wiring pattern of the invention.
Figure 1:
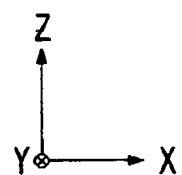

FIG. 1 is a schematic illustrating a photo irradiation device of the first exemplary embodiment of the invention that is used for the method to form a wiring pattern of an exemplary aspect of the invention. In FIG. 1, a bank forming device 10 includes a laser light source 11 that emits a laser beam having a predetermined wave length and a stage 12 that supports a substrate 1 to be treated (a first substrate). The laser light source 11 and the stage 12 supporting the substrate 1 are provided in a chamber 14. A suction unit 13 that is capable of suctioning gas inside the chamber 14 is connected to the chamber 14. In this exemplary embodiment, a near-infrared semiconductor laser (wave length is 830 nm) is used as the laser light source 11.

Here, three directions are referred as follows and will be used in the following explanations. An X-axis direction is a predetermined direction in a horizontal plane. A Y-axis direction is the direction perpendicular to the X-axis direction in the horizontal plane. A Z-axis direction is the direction perpendicular to the X-axis direction and the Y-axis direction respectively (vertical direction).

The stage 12 is provided so as to be movable in the X-axis direction and the Y-axis direction while supporting the substrate 1. The substrate 1 can move in response to the light beam emitted from the light source 11 with transportation by the stage 12. In addition, the stage 12 also can move in the Z-axis direction. Here, an optical system (not shown) is located between the light source 11 and the substrate 1 supported by the stage 12. A position of the substrate 1 in response to a focal point of the optical system can be adjusted by the transportation of the stage 12 supporting the substrate 1 in the Z-axis direction. Accordingly, the light beam emitted from the light source 11 irradiates the substrate 1 supported by the stage 12.

In the substrate 1, a photo thermal converting layer 8 is formed which includes a photo thermal converting material that converts light energy to thermal energy. A sublimation layer 9 including a sublimable material is formed on the photothermal converting layer 8. For the substrate 1, a glass substrate and a transparent polymer or the like are exemplified. For the transparent polymer, a polyester, such as polyethylene terephthalate, a polyimide, a polyacryl, a polyepoxy, a polyethylene, a polystyrene, a polycarbonate, and a polysulfone or the like are exemplified. If the substrate is made by the transparent polymer, it may have a thickness from 10 to 500 μm. This makes it possible, for example, to form a belt like substrate so as to be winded in a roll, thereby enabling the substrate to be transferred while holding with a rotating drum or the like.

In this exemplary embodiment, the substrate 1 is supported by the stage 12 that performs translation movement in the X-axis and Y-axis direction. However, if the substrate 1 is held with a rotating drum, the rotating drum can perform a horizontal translation movement (in a scanning direction, specifically the X-axis direction), a movement in a rotating direction (the Y-axis direction) and in a vertical direction (in the Z-axis direction).

For the photo thermal converting material making the photo thermal converting layer 8, any suitable material can be used. Any material that can convert a laser light to heat efficiently may be used. Aluminum, a metal layer made of oxide and/or sulfide of aluminum, a carbon black, an organic layer made of a polymer in which a graphite or infrared ray absorption dye or the like are added, or the like are exemplified. For the infrared ray absorption dye, an anthraquinone, a dithiol nickel complex, a cyanine, an azo-cobalt complex, a diimmonium, a squalelium, a phthalocyanine, and a naphthalocyanine or the like are exemplified.

If the above-mentioned metal layer is used as the photothermal converting layer 8, the metal layer can be formed on the substrate 1 using a vacuum deposition, an electron beam deposition, and a sputtering. If the above-mentioned organic layer is used as the photo thermal converting layer 8, the organic layer can be formed on the substrate 1 using a common film coating method, for example, an extrusion coating method, a spin coating method, a gravure coating method, a reverse-roll coating method, a rod coating method, a micro-gravure coating method, and a knife coating method.

If the photo thermal converting layer 8 is formed, light having a wavelength in response to the photo thermal converting material may be used. A wavelength range of the light that is well absorbed differs in the photothermal converting materials used. Thus, light energy can be converted to thermal energy efficiently by irradiating light having a wavelength in response to the photothermal converting material. Specifically, the photothermal converting material is chosen in response to the light irradiated. In this exemplary embodiment, since the near-infrared semiconductor laser (wave length is 830 nm) is used as the laser light source, a material having a characteristic to absorb light from infrared to visible light region may be used.

The sublimation layer 9 includes a sublimable dye dissolved or dispersed in a binder resin. The layer including no binder resin is also applicable. For the sublimable material, a suitable sublimable material (sublimable dye) can be used. For example, the following can be used: a disperse dye, a basic dye, and an oil-soluble dye, which are disclosed in Japanese Unexamined Patent Publication No. 6-99667; a cyanine, a merocyanine, an amine cation radical dye, a squarylium dye, a chroconium dye, a tetraallyl polymethine dye, and an oxonol dye, which are disclosed in Japanese Unexamined Patent Publication No. 9-127644; and materials disclosed in Japanese Unexamined Patent Publication No. 2001-514106. The sublimation layer 9 may be formed by one layer and by a plurality of layers.

If the binder resin is used in the sublimation layer 9, any suitable binder resin can be used. A polyamide resin, a polyester resin, an epoxy resin, a polyurethane resin, a polyacryl resin (for example, polymethyl methacrylate, polyacrylamide, polystyrene-2-acrylonitrile), a vinyl resin, such as polyvinyl pyrrolidone, a polyvinylchloride resin (for example, a vinyl chloride-vinyl acetate copolymer), a polycarbonate resin, polystyrene, polypheniylene oxide, a cellulose resin (for example, methyl cellulose, ethyl cellulose, carboxy methyl cellulose, cellulose acetate hydrogen phthalate, accetylcellulose, cellulose acetate propionate, cellulose acetate butylate, cellulose triacetate), a polyvinyl alcohol resin (for example, a partially saponified polyvinyl alcohol such like polyvinyl alcohol, polyvinyl butyral), a petroleum resin, a rosin derivative, a coumarone-indene resin, a terpene resin, and a polyolefin resin (for example, polyethylene, polypropylene) are applicable.

For an organic solvent to dissolve or disperse the above-mentioned dyes and binder resins, the organic solvent including a monohydric alcohol is used. N-butyl alcohol (b.p. 117.4 degrees centigrade), isobutyl alcohol (b.p. 108.1 degrees centigrade), sec-butyl alcohol (b.p. 100 degrees centigrade), n-amyl alcohol (b.p. 138 degrees centigrade), isoamyl alcohol (b.p. 132 degrees centigrade), and hexyl alcohol (b.p. 155.7 degrees centigrade) are exemplified. The above-mentioned alcohols and another organic solvents can be mixed for use. A suitable solvent can be used as the organic solvent to be mixed for use. Ketone series, such as methyl ethyl ketone, methyl isobutyl ketone, and cyclohexanone or the like, aromatic series such like toluene, and xylene or the like, halogen family, such as dichlomethane, and trichloroethane or the like, esters, such as ethyl acetate, and propyl butyrate or the like, dioxane, tetrahydrofuran, or the like, and these mixtures are exemplified.

The sublimation layer 9 and the organic layer can be formed on the photothermal converting layer 8 using the common film coating method, for example, the extrusion coating method, the spin coating method, the gravure coating method, the reverse-roll coating method, the rod coating method, the micro-gravure coating method, and the like. In these coating methods for the sublimation layer 9, a function liquid for sublimation layer forming may be uniformly formed on the photothermal converting layer 8 after discharging electrostatic charged on a surface of the photo thermal converting layer 8. In addition, a discharging unit may be fixed to a device used for each method.

Figure 2A:
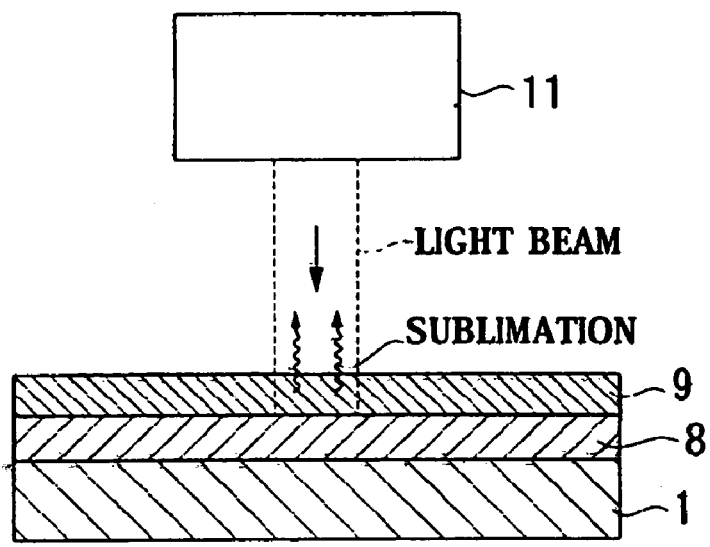
FIGS. 2(a) and 2(b) are schematics illustrating a process of the method to form a wiring pattern of the invention.
Figure 2B:
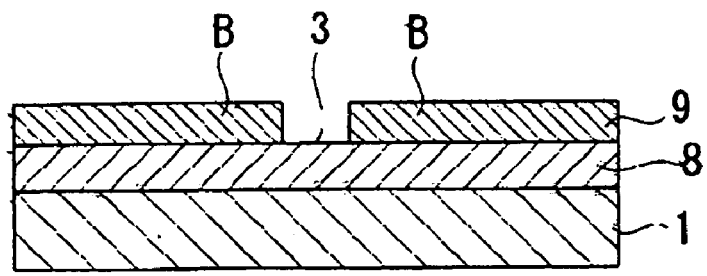

A procedure to form a bank will be explained with reference to FIG. 2. As shown in FIG. 2(a), laser beam having a predetermined light beam diameter is irradiated to the substrate 1 from its upper surface side in which the sublimation layer 9 is formed. By the irradiation of the laser beam, the photothermal converting layer 8 corresponding to the irradiated position generates heat so as to heat the sublimation layer 9 located on the layer 8. Thus, as shown in FIG. 2(b), this heat sublimates the sublimable material of the sublimation layer 9 so as to remove the sublimable material (sublimation layer 9) corresponding to the irradiated position from the substrate 1. Consequently, banks B are formed such that the photothermal converting layer 8 is exposed at a groove 3 between the banks B.

At this time, by transferring the stage 12 along the X-Y plane in response to the laser beam irradiated, the groove 3 is formed in response to a traveling locus of the stage 12. In this way, a bank pattern defining a predetermined region on the substrate 1 is formed on the substrate 1.

The sublimable materials sublimated by the light irradiation and the materials that come off from the substrate 1 with the sublimable materials are suspended in a chamber 14. However, these materials that come off from the substrate 1 can be collected by operating a suction unit 13 so as to suck gas into the chamber 14. Thus, the problem of the materials that come off from the substrate 1 adhering again to the groove 3 or the banks B is reduced or prevented from occurring.

As mentioned above, by irradiating light to the substrate, including the photothermal converting layer 8 and the sublimation layer 9, heat is generated from the photothermal converting layer 8 due to the irradiated light. The heat sublimates the sublimable material so as to be removed from the substrate 1. Accordingly, by irradiating light to the region corresponding to a bank pattern to be formed, the banks B having a desired pattern can be formed on the substrate 1 with removing the sublimable material on the irradiated region.

In this exemplary embodiment, the banks B (groove 3) are formed on the substrate 1 by transporting the stage 12 supporting the substrate 1. However, a light beam to be irradiated may be transferred while resting on the substrate 1. Also, both the substrate 1 and light may be transferred. In addition, if the substrate 1 is transferred, a configuration that the substrate 1 is transferred while being held by the rotating drum as mentioned above can be employed other than the configuration that the substrate 1 is transferred by the stage 12 in the X-Y plane.

Figure 3:
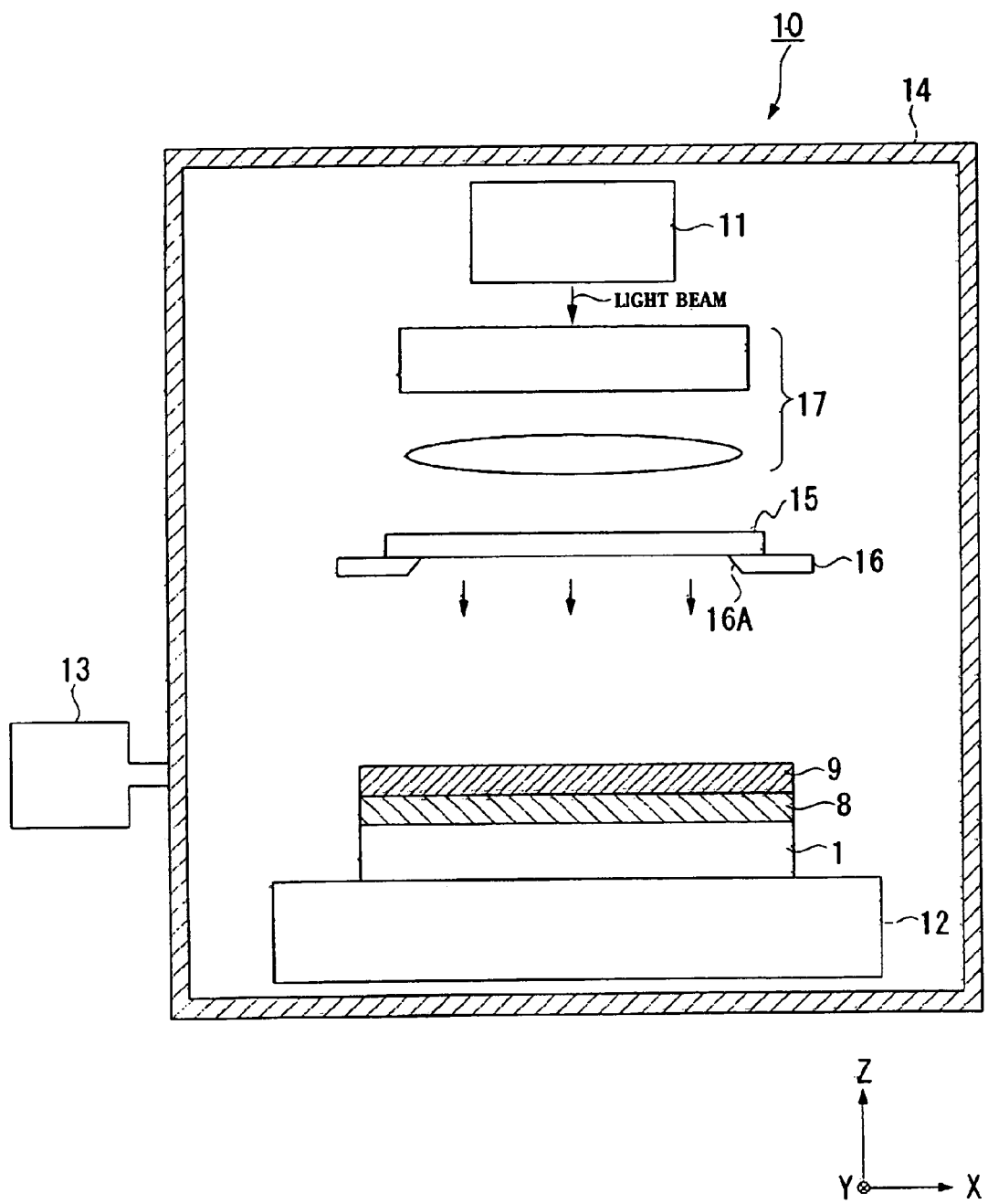
FIG. 3 is a schematic illustrating another embodiment of the light irradiation device used for the method for forming a wiring pattern of the invention.

In forming the bank pattern, as shown in FIG. 3, a light beam may be irradiated to a mask 15 having a pattern corresponding the bank pattern to be formed such that the light through the mask 15 irradiates the substrate 1. In the example shown in FIG. 3, the mask 15 is supported by a mask supporting part 16 having an opening 16A into which the light transmitted from the mask 15 passes through. The light beam emitted from the light source 11 is converted to illuminating light having a uniform illuminance distribution so as to illuminate the mask 15. The light passed through the mask 15 irradiates the substrate 1 (photothermal converting layer 8 and sublimation layer 9). The irradiated light causes the heat generated from the photothermal converting layer 8 to sublimate the sublimable material, thereby forming the bank pattern. Using mask pattern 15, the bank pattern can be formed finer than the diameter of a light beam emitted from the laser light source 11. In the example shown in FIG. 3, the light is irradiated to the substrate 1 in a condition in which the mask and the substrate 1 are placed apart from each other. However, the light may be irradiated to the mask 15 in a condition in which the mask 15 and the substrate 1 are closely stuck together such that the light passed through the mask 15 irradiates the substrate 1.

A conductive paste is applied to the groove 3, which is formed between the banks B by the above-mentioned processes, so as to form a conductive layer in a fixed pattern corresponding to the groove pattern. A process for forming a conductive layer will be described later. Here, in the process for forming banks as mentioned above, an adjustment material for lyophilicity (here, lyophilicity to a conductive paste) adjustment may be mixed into the sublimation layer 9 that forms the banks. For example, the sublimation layer 9 into which the adjustment material is mixed can be formed on the substrate 1 as follows. The adjustment material for lyophilicity adjustment is mixed preliminarily into a function liquid for sublimation layer formation. Then, the function liquid is applied to the groove 3 formed on the substrate 1 (on the photothermal converting layer 8).

For the adjustment material, materials having lyophobicity such like a fluorine-containing compound and silicone compound are exemplified. In this way, lyophobicity can be given to the banks B made of the sublimation layer 9. The banks B to which lyophobicity is given have the following advantage. For example, in the case in which the function liquid is applied to the groove 3 between the banks B by the liquid drop ejecting method, even if the function liquid is applied in the vicinity of upper part of the groove including the upper surface of the banks B, the function liquid can be flowed to the bottom of the groove 3 between the banks B due to the lyophobicity, thereby enabling the function liquid to be applied in a desired condition.

For the fluorine-containing compound, a monomer, an oligomer and a polymer that includes a fluorine atom in the molecule, and a surfactant including fluorine, or the like are exemplified. It is preferable that these fluorine-containing compounds are compatible with or dispersible with a binder resin included in the sublimation layer 9. The fluorine-containing compound and/or the silicone compound may be mixed into the sublimation layer 9. For the silicone compound, a resin including organic polysiloxane in major proportions, a rubber, a surfactant, and coupling agent or the like are exemplified.

Multiple sublimation layers, each of which has different lyophilicity to liquid (a function liquid) may be formed. This makes it possible to control the position, and the wetting and spreading condition of the function liquid applied closer to a desired state. Especially, the construction where a first sublimation layer and a second sublimation layer are formed on the substrate 1 in this order has the following advantages. Here, lyophobicity of the second sublimation layer is relatively higher than that of the first sublimation layer. For example, if a function liquid is applied to the groove between the banks B, the function liquid can wet and spread over in vicinity of the bottom of the groove 3 between the banks B. In addition, if the function liquid is applied in the vicinity of the upper part of the groove including the upper surface of the banks B, the region having lyophobicity formed at the upper part of the groove can flow the function liquid, applied in the vicinity of the upper part, to the bottom of the groove 3 between the banks B. In order to differentiate lyophobicity of each sublimation layer, each amount of the adjustment material (fluorine-containing compound or silicone compound) mixed into each sublimation layer is differentiated.

In addition, the intermediate layer to make uniform a photothermal converting function of the photothermal converting layer 8 can be formed between the photothermal converting layer 8 and the sublimation layer 9. Resin materials are exemplified as the material for forming the intermediate layer. The intermediate layer can be formed by applying and drying a resin composition having a fixed composition on the surface of the photothermal converting layer 8. As for the applying method, a suitable coating method, such as spin coating, gravure coating, die coating, or the like are exemplified. The photothermal converting layer 8 converts light energy to thermal energy by irradiation of a light beam. Further, the intermediate layer serves to make uniform the thermal energy. Consequently, uniform thermal energy is supplied to a part of sublimation layer 9 corresponding to a region for light irradiation.

Figure 4:
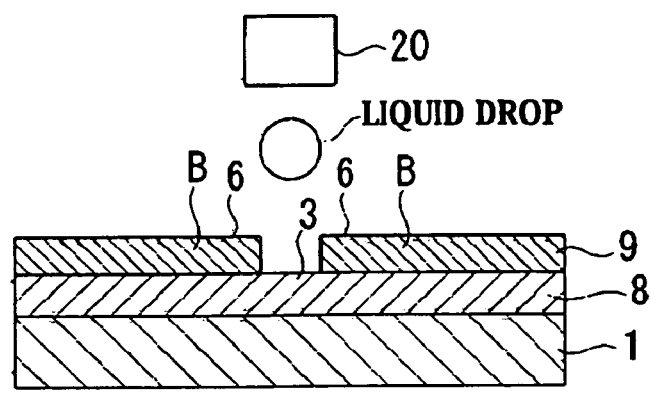
FIG. 4 is a schematic illustrating a process following FIG. 2.

Next, a process to form a conductive layer will be explained. In the process, a conductive material is provided to the groove 3 between the banks B so as to form the conductive layer (conductive pattern layer) having a fixed pattern corresponding to a pattern of the groove. FIG. 4 is a schematic illustrating a method to form a conductive pattern layer on the substrate 1 (on the photothermal converting layer 8) using the banks B. In this exemplary embodiment, the liquid drop ejection method (the inkjet method), in which liquid drops of function liquid, including a material to form a wiring pattern are ejected, is used in order to provide a conductive material (the material to form the wiring pattern) to the groove 3 between the banks B. The banks B are provided so as to define the region to form the wiring pattern that has been preset on the substrate 1. In the liquid drop ejecting method, liquid drops of function liquid, including the material to form the wiring pattern; are ejected to the groove 3 between the banks B while keeping an ejection head 20 and the substrate 1 to be faced each other.

For ejecting techniques of the liquid drop ejecting method, a charge control method, a pressurized vibration method, an electrothermal converting method, an electrostatic attraction method, an electromechanical converting method, or the like are exemplified. In the charge control method, electric charge is applied to a material by a charge electrode. The material is ejected from an ejection nozzle by controlling a flying direction of the material with a deflection electrode. The pressurized vibration method is a method where ultra-high pressure of approximately 30 kg/cm$^2$ is applied to a material so as to eject the material at the tip of a nozzle. If no control voltage is applied, the material goes straight ahead so as to be ejected from the ejection nozzle. If the control voltage is applied, electrostatic repelling occurs in the material so as to disperse the material, thereby ejecting no material from the ejection nozzle. In the electrothermal converting method, a heater provided in space in which a material is trapped evaporates the material rapidly so as to produce bubbles, thereby ejecting the material in the space by pressure of the bubbles. In the electrostatic attraction method, micro pressure is applied to a space in which a material is trapped so as to form a meniscus of the material at an ejection nozzle. Then, electrostatic attraction is applied to this condition so as to pull out the material. The electromechanical converting method utilizes a characteristic of a piezo element (piezoelectric element) so that the element is deformed by an electric pulse signal. The deformation of the piezo element applies pressure to a space in which a material is trapped with a flexible material so as to push out the material from the space, thereby ejecting the material from an ejection nozzle. Techniques are applicable that includes a method utilizing a viscosity change of fluid with electric fields, and a method utilizing discharge sparks for ejecting, or the like. The liquid drop ejecting method has an advantage that a desired amount of a material can be provided at a desired position adequately with little waste in material usage. Here, an amount of one drop of a liquid material ejected by the liquid drop ejecting method is, for example, from 1 to 300 nanograms. In this exemplary embodiment, the electromechanical converting method is used.

Figure 5:
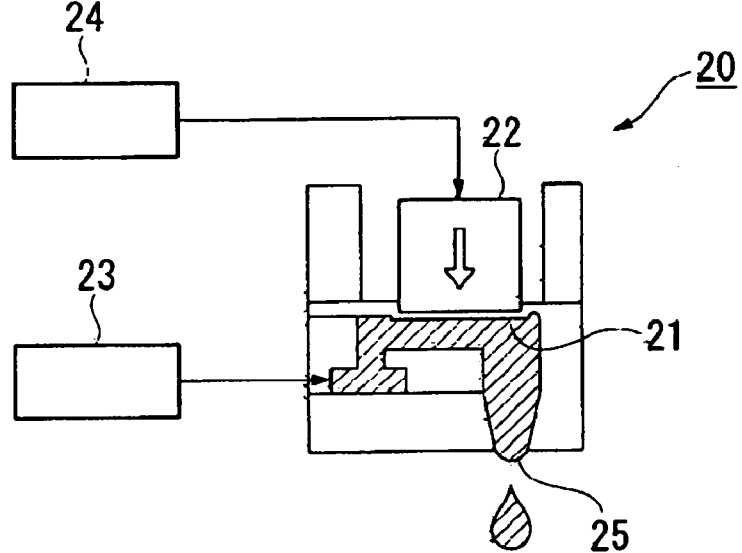
FIG. 5 is a schematic illustrating an example of an ejection head used for the method for forming a wiring pattern of the invention.

FIG. 5 is a schematic explaining an ejecting principal of function liquid (liquid material) by the piezo method. In FIG. 5, the ejection head 20 includes a liquid chamber 21 in which a function liquid (liquid material including a material to form a wiring pattern) and a piezo element 22 provided adjacent to the liquid chamber 21. The function liquid is supplied to the liquid chamber 21 through a supply system 23 including a material tank for function liquid storage. Since the piezo element 22 is connected to a driving circuit 24, a voltage is applied to the piezo element 22 via the driving circuit 24 so as to deform the piezo element 22. This deforms the liquid chamber 21 so as to eject the function liquid from an ejection nozzle 25. In this case, a strain amount of the piezo element 22 is controlled by changing a value of applied voltage. In addition, a strain velocity of the piezo element 22 is controlled by changing a frequency of the applied voltage. The liquid drop ejecting by the piezo method has the advantage that few influences are given to a composition of a material since no heat is applied.

A procedure to form a wiring pattern will be explained below. After forming the banks B made of the sublimation layer 9 using the above-mentioned methods, first a residue processing may be performed to remove a residue at the bottom of the groove 3 between the banks B (exposed part of the photothermal converting layer 8). The residue processing is performed by irradiating light, ultraviolet light or the like as examples, to the bottom of the groove 3. This causes photo excitation so as to enable the residue, especially an organic residue, remaining the bottom to be well removed.

Figure 7:
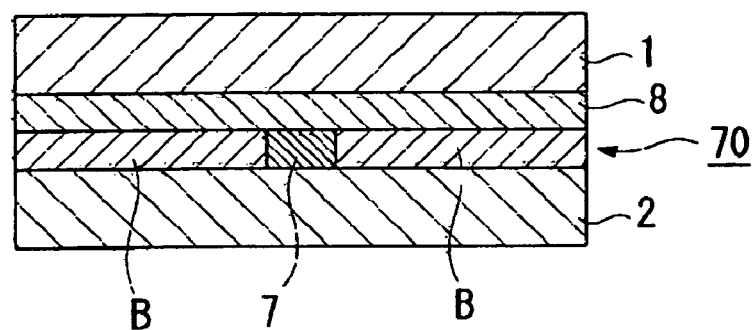
FIG. 7 is a schematic illustrating a process following FIG. 6.

Next, a material providing process is performed. In the material providing process, liquid drops of function liquid including material to form the wiring pattern are provided to the groove between the banks B on the photothermal converting layer 8 using the ejection head 20. In this case, an organic silver compound is used as a conductive material that forms a material to form the wiring pattern. Diethylene glycol diethyl ether is used as a solvent (dispersion medium). Thus, the function liquid including the organic silver compound of the solvent is ejected. In the material providing process, as shown in FIG. 7, the function liquid including the material to form the wiring pattern is ejected from the ejection head 20 as drops. The drops ejected are provided to the groove 3 between the banks B on the photothermal converting layer 8. In this case, the region to from the wiring pattern, to which the liquid drops are ejected, is marked off by the bank B made of the sublimation layer 9 so as to reduce the likelihood or prevent the liquid drops from being spread over a part excluding a fixed position. In addition, since banks B have lyophobicity, even if a part of the liquid drops ejected is placed on the banks B, the liquid drops are flowed to the groove 3 between the banks. Further, if lyophilicity is given to the bottom of the groove 3 in which the photothermal converting layer 8 is exposed, this makes it easy to spread the liquid drops ejected over the bottom. Thus, the function liquid can be provided uniformly in the fixed location. Specifically, a difference in wettability between the banks B and the bottom of the groove 3 is preferable that, for example, 40 degrees and above in static contact angle for water.

For the function liquid, the dispersion in which conductive fine particles are dispersed into a dispersion medium also can be used. For the conductive fine particles, for example, metal fine particles including at least any one of gold, silver, cupper, palladium, and nickel, their oxides, and fine particles of a conductive polymer or a super-conductive material or the like are employed. Any dispersion medium that is capable of dispersing the above-mentioned conductive particles and does not cause an aggregation can be used. For example, other than water, alcohols, such as methanol, ethanol, propanol, butanol, or the like, a hydro-carbon compounds, such as n-heptane, n-octane, decane, dodecane, tetradecane, toluene, xylene, cymene, durene, indene, dipentene, tetrahydronaphthalene, decahydronaphthalene, cyclohexylbenzene or the like, an ether compounds, such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl)ether, p-dioxane, or the like, and a polar compounds, such as propylene carbonate, gamma-butyrolactone, N-methyl-2-pyrrolidone, dimethylformamide, dimethyl sulfoxide, cyclohexanone, or the like are exemplified. Water, the alcohols, the carbon hydride series compounds, and the ether series compounds may be used for the dispersion medium. Water and the carbon hydride series compounds are much preferred from the following points of view: a dispersion of the fine particles, a stability of the dispersion, and an ease of the application for the liquid drops ejecting method.

Figure 6:
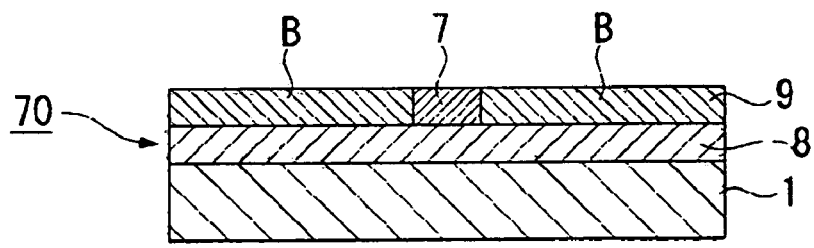
FIG. 6 is a schematic illustrating a process following FIG. 4.

After the material providing process (liquid drop ejection process), a drying process is performed so as to form a conductive pattern layer 70 in which a conductive layer 7 is provided in the banks B made of the sublimation layer 9 as shown in FIG. 6. The drying process is carried out in the conditions (temperature, atmosphere) in which the solvent used in the liquid drop ejection vaporizes.

After forming the substrate 1 including the conductive pattern layer 70 on the photothermal converting layer 8 by above-mentioned methods as shown in FIG. 6, a process to transfer the conductive pattern layer 70 to a substrate 2 (substrate to be treated: materials or the like are the same as those of the first substrate) is performed. The transferring process will be explained below.

First, the substrate 2 and the conductive pattern layer 70 are temporarily stuck together while keeping both to be faced as shown in FIG. 7. Subsequently, laser light is irradiated to this. Specifically, the irradiation is performed using a photo irradiation device as shown in FIG. 1. In this case, the light is irradiated to a whole area of the substrate 2. The photothermal converting layer 8 produces heat due to the light irradiation. The heat serves to transfer the conductive pattern layer 70 to the substrate 2. This is because the banks B include the sublimable material. In addition, the heat produced in the photothermal converting layer 8 due to the light irradiation serves to perform a firing to the conductive layer 7. Conductivity is achieved by performing the firing to the conductive layer. Especially, if an organic silver compound is used as the conductive material, the organic material is removed by the firing treatment, such that silver particles remain. As a result, the conductivity is exhibited. Alternatively, the firing process may be performed after ejecting the function liquid including the conductive material in prior to the transferring process.

Figure 8:
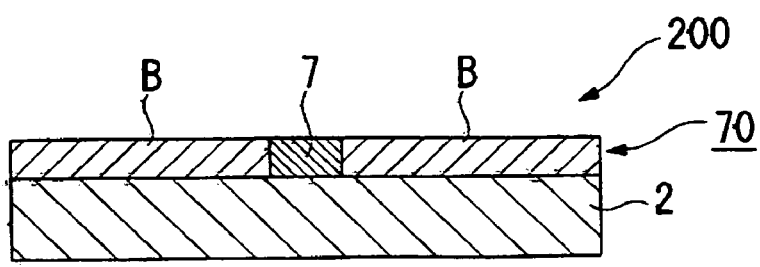
FIG. 8 is a schematic illustrating a process following FIG. 7.

By performing the transferring process, a wiring pattern 200 including the conductive layer 7 of a fixed pattern is formed on the substrate 2 as shown in FIG. 8. The banks B remaining on the substrate 2 can be removed (ashing) after transferring process. For example, the banks B can be removed from the substrate 2 by irradiating laser light to the banks B (sublimation layer 9) or cleaning with a given solvent. For an ashing treatment, a plasma ashing, an ozon ashing, or the like can be employed.

As above-mentioned, the method to form the wiring pattern of this exemplary embodiment is the following. Light is selectively irradiated to a predetermined region of the first substrate 1 that includes the photothermal converting layer 8 and the sublimation layer 9. The banks B made of the sublimation layer 9 are formed corresponding to the region for light irradiation. Then, the conductive layer 7 is provided in the banks B that have been formed. The substrate to be treated 2 and the conductive pattern layer 70 including the banks B and the conductive layer 7 are faced. Then, the light irradiation is performed again to the substrate 2. Heat is applied to the sublimation layer 9 (banks B) in the conductive pattern layer 70 from the photothermal converting layer 8 so as to transfer the conductive pattern layer 70 to the substrate to be treated 2. As a result, a predetermined conductive pattern layer 70 is formed on the substrate to be treated 2. Since a surface layer of the conductive layer 7 in the conductive pattern layer 70 is originally an interface to the photothermal converting layer 8, the surface layer of the conductive layer 7 has a surface shape having extreme flatness with few convexo-concaves. Thus, a wiring pattern formed by the above-mentioned methods can contribute to enhance display characteristic if the wiring pattern is used to an electro-optic device, such as a liquid crystal display device or the like. The method for forming wiring pattern of the exemplary embodiment can be applied to a semiconductor device for wiring forming.

Electro-Optic Device

Figure 9:
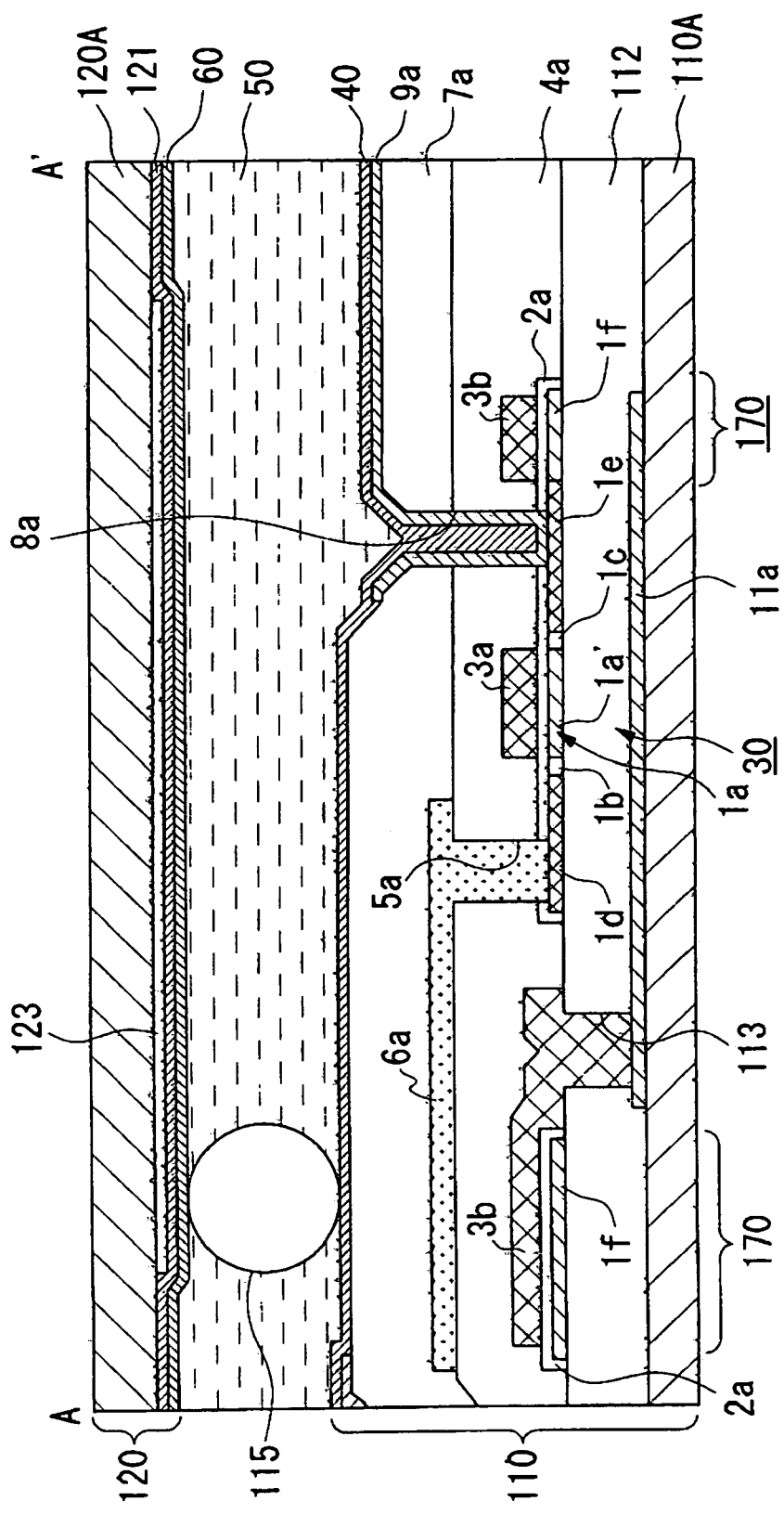
FIG. 9 is a schematic illustrating an example of an electro-optic device of the invention.

For an example of an electro-optic device including a wire pattern formed by the method to form a wiring pattern of an exemplary aspect of the invention, a liquid crystal display device will be explained with reference to FIG. 9. The liquid crystal display device of the exemplary embodiment is an active matrix type liquid crystal display using TFT (Thin Film Transistor) as a switching element. FIG. 9 is a schematic illustrating a cross-sectional structure.

As shown in FIG. 9, the liquid crystal display device of the exemplary embodiment includes the construction in which a liquid crystal layer 50 is sandwiched between a TFT array substrate 110 and a facing substrate 120 is placed so as to be faced to the TFT array substrate 110. The TFT array substrate 110 is constructed mainly by a substrate body 110A made of a transparent material, such as quartz or the like, a TFT element 30, a pixel electrode 9a, and an orientation film 40. The TFT element 30, a pixel electrode 9a, and an orientation film 40 are formed on the surface of the substrate body 110A that faces the liquid crystal layer 50. The facing substrate 120 is constructed mainly by a substrate body 120A made of the transparent material, such as a glass and the quartz or the like, a common electrode 121 and an orientation film 60. The common electrode 121 and an orientation film 60 are formed on the surface of the substrate body 120A that faces the liquid crystal layer 50. The substrate 110 and 120 are kept at a fixed distance (gap) by a spacer 115.

In the TFT array substrate 110, a pixel electrode 9 is formed on the surface facing the liquid crystal layer 50 of the substrate body 110A. In the vicinity of each pixel element 9a, a TFT element for pixel switching (semiconductor device) 30, performing a switching control for each element 9a, is formed. The TFT element for pixel switching 30, which includes LDD (Lightly Doped Drain) structure, includes a scanning line 3a, a channel region 1a' of a semiconductor layer 1a' in which a channel is formed by an electric field from the scanning line 3a, a gate insulator 2a that insulates the scanning line 3a and the semiconductor layer 1a, a data line 6a, a low concentration source region 1b and a low concentration drain region 1c of the semiconductor layer 1a, a high concentration source region 1a and a high concentration drain region 1d of the semiconductor layer 1a.

A contact hole 5a connected to the high concentration source region 1d and a second interlayer insulator 4, in which a contact hole 8a connected to the high concentration drain region 1e is opened, are formed above the substrate body 110A including above the scanning line 3a and above the gate insulator 2a. Thus, a data line 6a is electrically connected to the high concentration region 1d through the contact hole passing through the second interlayer insulator 4a.

A third interlayer insulator 7a, in which the contact hole 8a connected to the high concentration drain region 1e is opened, is formed on the data line 6a and on the second interlayer insulator 4a. Thus, the high concentration drain region 1e is electrically connected to the pixel electrode 9a through the contact hole 8a passing through the second interlayer insulator 4a and the third interlayer insulator 7a.

In this exemplary embodiment, a storage capacitance 170 is constructed by the followings. The gate insulator 2a is extended from the position facing the scanning line 3a so as to be used as a dielectric layer. The semiconductor layer 1a is extended so as to be a first storage capacitance electrode 1f. A part of the capacitance line 3b facing the dielectric layer and the first storage capacitance electrode 1f is used as a second capacitance electrode.

In addition, a first light-shielding layer 11a is formed at the region in which the TFT element for pixel switching 30 is formed on the surface facing the liquid crystal layer 50 of the substrate body 110A of the TFT array substrate 110. The first light-shielding layer 11a reduces the likelihood or prevent at least the channel region 1a', the low concentration source region 1b and drain region 1c of the semiconductor layer 1a from being exposed to an incident light. The light transmits the TFT array substrate 110. Then, the light is reflected at the bottom surface of the TFT array substrate 110 (interface between the TFT array substrate 110 and air) so as to travel in a direction to the liquid crystal layer. In addition, an orientation film 40, that controls an orientation of liquid crystal molecules in the liquid crystal layer 50 when no voltage is applied, is formed on the utmost surface facing the liquid crystal layer 50 of the TFT array substrate 110. Specifically the pixel electrode 9a and the third interlayer insulator 7a.

A second light-shielding layer 123 is formed at a region on a surface facing the liquid crystal layer 50 of the substrate body 120A that faces the region (non pixel region) in which the data line 6, the scanning line 3a, and TFT element for pixel switching 30 are formed. The second light-shielding layer 123 reduces the likelihood or prevents the channel region 1a', the low concentration source region 1b, and the low concentration drain region 1c of the semiconductor layer 1a of the TFT element for pixel switching element 30 from being exposed to an incident light. In addition, a common electrode 121, made of ITO or the like, is roughly formed on the entire surface facing the liquid crystal layer 50 of the substrate body 120A on which the second light-shielding layer 123 is formed. An orientation film 60 that controls an orientation of liquid crystal molecules in the liquid crystal layer 50, when no voltage is applied, is formed above the surface facing the liquid crystal layer 50 of the substrate body 120A.

In the liquid crystal display device of the exemplary embodiment, various wirings of the TFT element being a semiconductor device, various wirings to sending electric signals to the TFT element 30, and electrodes or the like, are formed using the method to form a wiring pattern of the above-mentioned exemplary embodiments. Thus, both the surfaces of the TFT array substrate 110 and the facing substrate 120, by which the liquid crystal layer is sandwiched, have few convexo-concave shapes. As a result, the problem of uneven rubbing on the orientation film 40 and 60 is hardly occurs. Consequently, the liquid crystal display device shows as a high-reliability electro-optic device having excellent display characteristics.

Electronic Equipment

Figure 10:
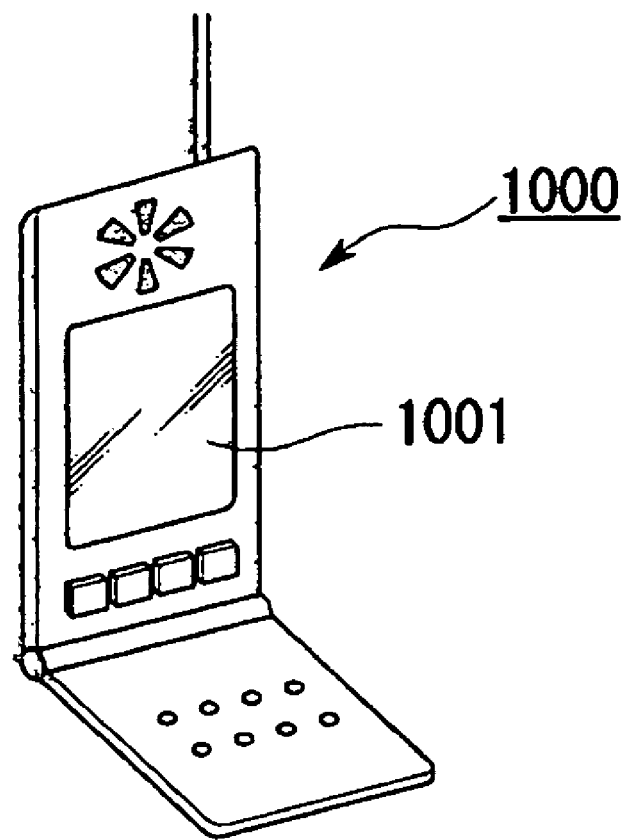
FIG. 10 is a schematic illustrating an example of electro equipment of the invention.

Application examples of electronic equipment including the above-mentioned liquid crystal display device (electro-optic device) will be explained below. FIG. 10 is a schematic illustrating an example of cellular phones. In FIG. 10, a cellular phone 1000 includes a display 1001 using the above-mentioned electro-optic device. Since the electronic equipment has the above-mentioned electro-optic device, this makes it possible for electronic equipment to have a bright display screen.

In addition to the above-mentioned examples, a watch, a word-processor, a monitor display for a personal computer, a liquid crystal display television, a viewfinder type video tape recorder, a direct-view monitor type video tape recorder, a car navigation device, a pager, a personal digital assistant, an electric calculator, a work station, a videophone, a POS terminal, equipment including an electronic paper and a touch-sensitive panel or the like are exemplified. The electro-optic device of an exemplary aspect of the invention can be employed as a display for the electronic equipment.

What is claimed is:

1. A method to form a wiring pattern, comprising:
   depositing a sublimation layer including a sublimable material on a photothermal converting layer including a photothermal material that converts light energy to thermal energy;
   sublimating a part of the sublimation layer by performing a first light irradiation to a fixed region of the sublimation layer so as to form banks made of the sublimation layer to a region excluding the fixed region;
   providing a conductive layer between the banks so as to form a conductive pattern layer formed by the conductive layer and the banks; and
   performing a second light irradiation to a fixed region of the photothermal layer in which the conductive layer is not formed so as to transfer the conductive pattern layer to a substrate to be treated, while keeping the substrate to be treated and the conductive pattern layer to be faced each other.

2. A method to form a wiring pattern, comprising:
   forming a photothermal converting layer, including a photothermal converting material that converts light energy, to thermal energy on a substrate;
   forming a sublimation layer including a sublimable material on the photothermal converting layer;
   sublimating a part of the sublimation layer by performing a first light irradiation to a fixed region of the sublimation layer so as to form banks made of the sublimation layer to a region excluding the fixed region;
   providing a conductive layer between the banks so as to form a conductive pattern layer formed by the conductive layer and the banks; and
   performing a second light irradiation to a fixed region of the photothermal layer in which the conductive layer is not formed so as to transfer the conductive pattern layer to a substrate to be treated, while keeping the substrate and the conductive pattern layer facing each other.

3. The method to form a wiring pattern according to claim 2, the photothermal material being mixed into the substrate.

4. The method to form a wiring pattern according to claim 2, the photothermal material being mixed into the sublimation layer.

5. The method to form a wiring pattern according to claim 2, the forming a sublimation layer including forming an insulator on which the sublimation layer is formed on the photothermal converting layer.

6. The method to form a wiring pattern according to claim 2, further including a gas producing layer including a gas producing material that produces gas by light or heat being provided between the substrate and the sublimation layer.

7. The method to form a wiring pattern according to claim 5, further including a gas producing layer including a gas producing material that produces gas by light or heat being provided between the substrate and the insulator.

8. The method to form a wiring pattern according to claim 1, a light irradiation condition differs between the first light irradiation and the second light irradiation.

9. The method to form a wiring pattern according to claim 1, further including the first light irradiation being performed with a mask having a fixed pattern.

10. The method to form a wiring pattern according to claim 2, further including performing the first light irradiation by relatively transferring the substrate on which the sublimation layer is stacked to the light irradiated.

11. The method to form a wiring pattern according to claim 1, further including performing the second light irradiation by a condition such that the conductive pattern layer is transferred to the substrate to be treated, and the conductive layer provided between the banks being fired.

12. The method to form a wiring pattern according to claim 1, further including performing the second light irradiation being performed under reduced pressure.

13. The method to form a wiring pattern according to claim 12, further including releasing the reduced pressure when the photothermal converting layer and the conductive layer are separated.

14. The method to form a wiring pattern according to claim 1, the sublimation layer including a sublimable dye.

15. The method to form a wiring pattern according to claim 1, the sublimation layer including an adjustment material adjusting lyophilicity.

16. The method to form a wiring pattern according to claim 1, the sublimation layer including a plurality of sublimation layers each of which has different lyophilicity.

17. The method to form a wiring pattern according to claim 1, the performing the second light irradiation including a surface treatment for lyophilicity adjustment to the banks.

18. The method to form a wiring pattern according to claim 1, the performing the second light irradiation including sucking and removing a material sublimated from the sublimation layer.

19. A method for manufacturing a semiconductor device, comprising:
   forming a wiring pattern by employing the method to form a wiring pattern according to claim 1.

20. A method for manufacturing a semiconductor device, comprising:
   forming a three-dimensional wiring by employing the method to form a wiring pattern according to claim 1.

21. An electro-optic device, comprising:
   a wiring pattern formed by the method to form a wiring pattern according to claim 1.

22. An electro-optic device, comprising:
   a semiconductor device manufactured by the method for manufacturing a semiconductor device according to claim 19.

23. Electronic equipment, comprising:
   the electro-optic device according to claim 21.

* * * * *